United States Patent
Bayram et al.

(10) Patent No.: US 8,916,451 B2
(45) Date of Patent: Dec. 23, 2014

(54) THIN FILM WAFER TRANSFER AND STRUCTURE FOR ELECTRONIC DEVICES

(71) Applicant: International Business Machines Corporation, Armonk, NY (US)

(72) Inventors: Can Bayram, Ossining, NY (US); Jack O. Chu, Manhasset Hills, NY (US); Christos Dimitrakopoulos, Baldwin Place, NY (US); Jeehwan Kim, White Plains, NY (US); Hongsik Park, Yorktown Heights, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/759,724

(22) Filed: Feb. 5, 2013

(65) Prior Publication Data

US 2014/0220764 A1 Aug. 7, 2014

(51) Int. Cl.
*H01L 21/762* (2006.01)

(52) U.S. Cl.
CPC ............................... *H01L 21/76251* (2013.01)
USPC ...... 438/458; 257/E25.032; 257/77; 257/455; 257/456; 257/458; 257/459; 117/951; 438/455

(58) Field of Classification Search
USPC .................... 438/457, 455; 257/E25.032, 77; 117/951
See application file for complete search history.

(56) References Cited

U.S. PATENT DOCUMENTS

| | | | |
|---|---|---|---|
| 5,389,799 A | 2/1995 | Uemoto | |
| 7,014,710 B2 | 3/2006 | Fang et al. | |
| 7,368,757 B2 | 5/2008 | Komiyama et al. | |
| 7,943,491 B2 | 5/2011 | Nuzzo et al. | |
| 8,043,977 B2 | 10/2011 | Ohachi et al. | |
| 8,076,717 B2 | 12/2011 | Sandhu et al. | |
| 8,198,621 B2 | 6/2012 | Rogers et al. | |
| 8,242,030 B2 | 8/2012 | Hannon et al. | |
| 2002/0031153 A1* | 3/2002 | Niwa et al. | 372/45 |
| 2003/0003687 A1* | 1/2003 | Yanagita et al. | 438/458 |
| 2007/0010067 A1* | 1/2007 | Shimoda et al. | 438/455 |
| 2010/0143726 A1 | 6/2010 | Golzhauser et al. | |
| 2010/0200881 A1 | 8/2010 | Masaki | |

(Continued)

FOREIGN PATENT DOCUMENTS

| | | |
|---|---|---|
| CN | 102637801 A | 8/2012 |
| EP | 2267761 A2 | 12/2010 |

(Continued)

OTHER PUBLICATIONS

Graphene by Solid-state decomposition of SiC. http://mvschandra.wordpress.com/research/graphene-by-solid-state-decomposition-of-sic/. May 23, 2011.*

(Continued)

*Primary Examiner* — Asok K Sarkar
*Assistant Examiner* — Eric Ashbahian
(74) *Attorney, Agent, or Firm* — Tutunjian & Bitetto, P.C.; Louis Percello

(57) ABSTRACT

A method for wafer transfer includes forming a spreading layer, including graphene, on a single crystalline SiC substrate. A semiconductor layer including one or more layers is formed on and is lattice matched to the crystalline SiC layer. The semiconductor layer is transferred to a handle substrate, and the spreading layer is split to remove the single crystalline SiC substrate.

20 Claims, 7 Drawing Sheets

(56) References Cited

U.S. PATENT DOCUMENTS

| | | | |
|---|---|---|---|
| 2010/0320445 A1* | 12/2010 | Ogihara et al. | 257/26 |
| 2010/0323164 A1 | 12/2010 | Ogihara et al. | |
| 2011/0048625 A1 | 3/2011 | Caldwell et al. | |
| 2011/0108854 A1 | 5/2011 | Sung | |
| 2011/0311722 A1 | 12/2011 | Faris | |
| 2012/0086021 A1 | 4/2012 | Wang | |
| 2012/0098024 A1 | 4/2012 | Hsu et al. | |
| 2012/0141799 A1 | 6/2012 | Kub et al. | |
| 2012/0175662 A1 | 7/2012 | Min et al. | |
| 2012/0211723 A1 | 8/2012 | Dimitrakopoulos et al. | |

FOREIGN PATENT DOCUMENTS

| | | | | |
|---|---|---|---|---|
| JP | 07-302889 | * | 11/1995 | H01L 27/12 |
| JP | 11-224856 | * | 8/1999 | H01L 21/208 |
| JP | 2009200177 A | | 9/2009 | |
| JP | 2011009268 | | 1/2011 | |
| JP | 2011105590 A | | 6/2011 | |

OTHER PUBLICATIONS

Jaegermann, E., et al. "CU and AG Deposition on Layered P-Type WSE2: Approaching the Schottky Limit" Physical Review B, vol. 42, No. 12. Oct. 1990. pp. 7487-7496.

Li, C., et al. "Preparation of Single- and Few-Layer Graphene Sheets Using CO Deposition on SIC Substrate" Journal of Nanomaterials, vol. 2011. May 2011. pp. 1-7.

Loher, T., et al. "Highly Oriented Layers of the Three-Dimensional Semiconductor CDTE on the Two-Dimensional Layered Semiconductors MOTE2 and WSE2" Journal of Applied Physics. Nov. 1996. pp. 5718-5722.

Loher, T., et al. "Van Der Waals Epitaxy of Three-Dimensional CDS on the Two-Dimensional Layered Substrate MOTE2(0001)" Journal of Applied Physics. Aug. 1994. pp. 555-557.

Office Action mailed on Jun. 18, 2014 for U.S. Appl. No. 13/759,711.

* cited by examiner

10

THIN FILM WAFER TRANSFER AND STRUCTURE FOR ELECTRONIC DEVICES

RELATED APPLICATION DATA

This application is related to commonly assigned application Ser. No. 13/759,711, filed concurrently herewith and incorporated herein by reference.

BACKGROUND

1. Technical Field

The present invention relates to semiconductor processing, and more particularly to fabrication processes and device structures using wafer transfer to form III-nitride electronic devices.

2. Description of the Related Art

Group III nitride materials are a unique group of semiconductor materials, which can be used in a wide variety of applications including, for example, optoelectronics, photovoltaics and lighting. Group III nitride materials are composed of nitrogen and at least one element from Group III, i.e., aluminum (Al), gallium (Ga) and indium (In). Illustrative examples of some common gallium nitrides are GaN, GaAlN, and GaAlInN. By changing the composition of Al, Ga and/or In within a Group III nitride material, the Group III nitride material can be tuned along the electromagnetic spectrum; mainly from 210 nm to 1770 nm. This spectrum includes a visible light emitting diode (LED), which is more than a 10 billion dollar industry with a forecasted double digit yearly growth rate. This continuous growth in LED demand enables the infrastructural build-up for the growth and fabrication of Group III nitride based semiconductor devices.

Light emitting diodes (LEDs) are energy efficient replacements to conventional light bulbs. LEDs are typically formed on a substrate and packaged in chips. The cost of conventional substrates (e.g., sapphire) is high, which increases the price of an LED chip. Such substrates are not reusable. LEDs include a front side contact and a back side contact formed on a same side of a substrate. Nonconductive substrates prevent back contact allocation, which leads to both contacts being formed on one side of the LED. This side-to-side contact allocation leads to current crowding effects degrading the carrier injection.

In addition, thermal conductivity of conventional sapphire substrates is about 42 W/m-k. Sapphire substrates provide marginal thermal management and produce higher junction temperatures. This leads to degradation of device characteristics and lifetime.

For other substrates, e.g., InGaN with an index of refraction ($n_{GaN}$) of 2.5, and critical angle ($\theta_c$) of about 23°, the light extraction efficiency is expected to be only 4%, assuming that one light escape cone is present in the LED structure. This leads to reduced external quantum efficiencies as generated light cannot couple out efficiently.

SUMMARY

An electronic device includes a spreading layer and a first contact layer formed over and contacting the spreading layer. The first contact layer is formed from a thermally conductive crystalline material having a thermal conductivity greater than or equal to that of an active layer material. An active layer includes one or more III-nitride layers. A second contact layer is formed over the active layer, wherein the active layer is disposed vertically between the first and second contact layers to form a vertical thin film stack.

Another electronic device includes a two-dimensional material spreading layer having a thickness of 1-5 monolayers. A first contact layer is formed over and contacts the spreading layer and is formed from a SiC crystalline material. An active layer includes a multiple quantum well (MQW) structure including a plurality of III-nitride periods and has a total thickness of less than about 100 nm. A second contact layer is formed over the active layer, wherein the active layer is disposed vertically between the first and second contact layers to form a vertical light emitting diode (LED).

A substrateless electronic device includes a first contact layer formed from a thermally conductive SiC crystalline material having a thermal conductivity greater than or equal to that of an active layer material. An active layer includes one or more III-nitride layers, and a second contact layer is formed over the active layer, wherein the active layer is disposed vertically between the first and second contact layers to form a vertical thin film stack.

A method for wafer transfer includes forming a spreading layer on a single crystalline substrate, the spreading layer includes a material having strong bonds in two dimensions and weak bonds in a third dimension; growing a crystalline layer on the spreading layer; forming one or more III-nitride layers on the crystalline layer; wafer bonding the one or more III-nitride layers to a handle substrate; and splitting the spreading layer along the weak bonds to remove the single crystalline substrate.

Another method for wafer transfer to form an electronic device includes forming a spreading layer on a single crystalline substrate; growing a crystalline layer on the spreading layer to form a first contact layer; forming an active layer including one or more III-nitride layers on the crystalline layer; forming a second contact layer over the active layer, wherein the active layer is disposed vertically between the first and second contact layers; wafer bonding the second contact layer to a handle substrate; and splitting the spreading layer to remove the single crystalline substrate.

A method for wafer transfer to form a light emitting diode includes forming a spreading layer, including one to five monolayers of graphene, on a single crystalline SiC substrate; growing a crystalline SiC layer to form a first contact layer; forming an active layer including one or more GaN layers on the crystalline SiC layer; forming a second contact layer formed over the active layer, wherein the active layer is disposed vertically between the first and second contact layers; wafer bonding the second contact layer to a handle substrate; and splitting the spreading layer to remove the single crystalline SiC substrate.

Another method for wafer transfer includes forming a spreading layer on a single crystalline substrate, the spreading layer includes a material having strong bonds in two dimensions and weak bonds in a third dimension, the spreading layer being spread to lattice match the single crystalline substrate; growing a crystalline layer on the spreading layer; forming one or more semiconductor layers on the crystalline layer; transferring the one or more semiconductor layers to a handle substrate; and splitting the spreading layer along the weak bonds to remove the single crystalline substrate.

Yet another method for wafer transfer includes forming a spreading layer, including graphene, on a single crystalline SiC substrate; forming a semiconductor layer including one or more layers lattice matched to the crystalline SiC layer; transferring the semiconductor layer to a handle substrate; and splitting the spreading layer to remove the single crystalline SiC substrate.

These and other features and advantages will become apparent from the following detailed description of illustra-

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
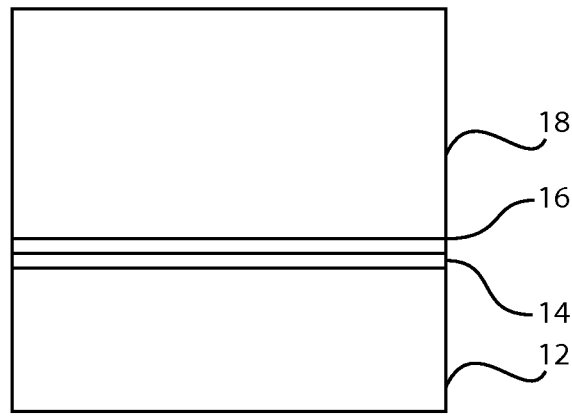
FIG. 1 is a cross-sectional view of a structure having a spreading layer formed between a single crystal substrate and a crystalline material in accordance with the present principles.

In accordance with the present principles, an advanced approach is provided for fabricating semiconductor devices, such as light emitting diodes (LEDs), which address the shortcomings of conventional methods and devices. In particularly useful embodiments, substrate materials and their processing are modified. A SiC substrate may include an LED epilayer or active layer, which can be removed from the SiC substrate (unlike sapphire or silicon). Therefore, the substrate can be reused. As the LED epilayer can stand alone (no base substrate is needed), two contacts (i.e., top and back) can be allocated on opposite sides of the epilayer enabling better current injection and performance. This further enables vertical LED (VLED) integration rather than lateral LED formation. VLEDs have better power output.

Removal of the thermally less conductive substrate (i.e., sapphire or silicon) enables more thermal conductivity (e.g., SiC layers and/or AlN submounts) to act as a heat transfer layer to a heat sink for reducing the junction temperature. Light extraction techniques such as surface roughening or photonic crystal employment can be easily implemented, after the substrate is removed. In one embodiment, the epilayer or active layer material may include GaN, which can be patterned much easier than sapphire due to lower hardness. While silicon absorbs visible light, e.g., half of the light generated will be absorbed by silicon, SiC is transparent to visible light. Other advantages, structures and methods will be described which further these and other illustrative goals in accordance with the present principles.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip or photonic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips or photonic devices. The resulting integrated circuit chips or photonic devices can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip or device is then integrated with other chips, discrete circuit elements, and/or other signal processing devices as part of either (a) an intermediate product, such as a motherboard, light source, etc., or (b) an end product. The end product can be any product that includes integrated circuit chips, ranging from toys and other low-end applications to advanced computer products having a display, a keyboard or other input device, and a central processor or any device that includes light emitting diodes or other photonic devices.

It should also be understood that material compounds will be described in terms of listed elements, e.g., InGaN, AlGaN, InGaAs or SiC. These compounds include different proportions of the elements within the compound, e.g., InGaAs includes $In_xGa_yAs_{1-x-y}$, where x, y are less than or equal to 1, or SiC includes $Si_xC_{1-x}$ where x is less than or equal to 1, etc.

In addition, other elements may be included in the compound, such as, e.g., AlInGaAs, and still function in accordance with the present principles. The compounds with additional elements will be referred to herein as alloys.

The present embodiments may be part of a photonic device or circuit, and the circuits as described herein may be part of a design for an integrated circuit chip, a printed wiring board, a display device, appliances, a light emitting device, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a structure 10 is illustratively shown for carrying out a lift-off process for formation of an electronic device in accordance with an exemplary embodiment. The structure 10 includes a single crystal substrate 12. In one embodiment, the single crystal substrate 12 may include any substrate material. SiC or alloys thereof will be illustratively described for the substrate 12. A spreading or separation layer 14 is formed on the substrate 12.

The spreading layer 14 preferably includes a two-dimensional (2D) material—strong bonds in two dimensions and weak bonds in a third dimension. A 2D material may include weak Van der Waals forces perpendicular to a layer (weak vertical bonding) such that the material separates easily along atomic layers or strata (e.g., strength in 2D directions). Such 2D materials can be employed as interlayers to facilitate layer transfer of subsequently grown semiconductor films.

While any substrates can be employed as the base substrate 12, the base substrate 12 should be capable of offering seed locations for single crystalline deposition (e.g., single crystalline graphene deposition). The spreading layer 14 may be deposited (epitaxially grown) on the substrate 12. The spreading layer 14 may include graphene, or other 2D materials, such as, e.g., $MoS_2$ or $WS_2$.

In one particularly useful embodiment, graphene is employed for spreading layer 14 and may be formed by a thermal decomposition of the (0001) face of a SiC wafer (substrate 12). Si removal from the SiC surface results in the formation of graphene at the surface of SiC. In another embodiment, epitaxial carbon monolayer deposition may be employed to form graphene on the surface of the SiC substrate 12.

In one embodiment, graphene is formed by heating SiC substrates to temperatures greater than 1000 degrees C. resulting in Si evaporation out from the substrates leaving monolayer(s) of single crystalline carbon, which is graphene. Any single crystalline material whose lattice matches the SiC substrate (12), e.g., the graphene lattice matches well to SiC substrates), can be grown on top of graphene.

Epitaxial graphene can be grown on semi-insulating 4H- or 6H-(0001) SiC wafer surfaces within an induction-heated graphite susceptor located in an evacuatable chamber (e.g., a stainless steel vacuum chamber or quartz tube furnace) using a multistep process comprising surface preparation steps. For example, these steps may include annealing at 810° C. for 10 min and 1140° C. for 7 min under flow of 20% disilane in He, or annealing at a temperature around 1600° C. in $H_2$ gas. Then, a graphenization step is employed at 1450-1620 degrees C. under Ar flow at a chamber pressure from 3.5 mTorr to 900 mTorr for durations of 5 min to 2 hours. Other process parameters are also contemplated.

Graphene is atomically smooth and when applied to the substrate 12, a small thickness is desired. In one embodiment, the thickness of the graphene spreading layer 14 is preferably one monolayer, although 1-5 monolayers are acceptable. In useful embodiments, no residual graphene may be preferred, but realistically only a few monolayers of grapheme may be employed depending on what is needed to cleanly separate the graphene to produce a wafer split as will be described. Graphene absorbs about 3% of the visible light per monolayer—thus for the highest light extraction; less is better. However, graphene is a "perfect" conductor, and thus assists in current spreading of hole (p-type carriers) injection. Therefore, a single monolayer is desirable.

An epitaxially grown layer 16 may be formed on the spreading layer 14 (e.g., graphene). The layer 16 may include SiC, but preferably includes a material with a thermal conductivity that is greater than that of active layer (epilayer) materials (e.g., GaN) for the later formed electronic device.

It is a difficult task to form 3D materials (substrate lattices) on 2D materials as the 3D materials tend to form clusters on the 2D materials due to weak substrate overlayer interactions (e.g., Volmer-Weber growth mode) (See e.g., W. Jaegermann, C. Pettenkofer, and B. A. Parkinson, Phys. Rev. B 42, 7487 (1990)). In accordance with the present principles, considering that the lattice constant of SiC (a(SiC)=3.1 angstroms) is close but not the same as the lattice constant of GaN (a(GaN) =3.2 angstroms), and that the lattice constant of free standing graphene (a(graphene)=2.5 angstroms) is not close, SiC and GaN have a large lattice mismatch with free-standing graphene. However, if the graphene (14) is formed on a SiC substrate (12), this graphene is strained to have a same lattice constant as the SiC substrate. Therefore, SiC deposition on a graphene/SiC substrate can be provided without lattice mismatch.

In such cases, by matching the substrate 12 with a 2D material that complies with the substrate on which it is grown, a semiconductor substrate 18 can be grown to match the substrate 12 with less concern about the intervening 2D material (e.g., graphene). In the example described, GaN or other material (18) (e.g., GaN, GaAlN, GaAlInN, etc.) can be deposited on SiC (12), which is easier because 3D materials are in effect being grown on 3D materials rather than 3D materials being grown on 2D materials. In other words, the lattice of the graphene spreading layer 14 is formed on the SiC substrate 12, which can offer a larger lattice of graphene so it can be better matched to optoelectronic or other semiconductor materials. In addition, a thin SiC layer (16) may optionally be epitaxially grown on graphene, and over the SiC substrate, as a buffer to ensure easier epitaxial growth for substrate 18 (3D on 3D materials).

When GaN is employed on a graphene spreading layer 14, it is preferable to employ the buffer layer 16 (e.g., epitaxial SiC). The SiC layer 16 also acts as a diffusion buffer layer since GaN directly on graphene may result in nitridation of the graphene. Therefore, SiC layer 16 on graphene 14 on a SiC substrate 12 is a particularly useful embodiment for making a template for GaN deposition on SiC films. SiC epitaxy (layer 16) on graphene (14) on the SiC substrate (12) is as easy as epitaxially growing a SiC film on a SiC substrate since the graphene lattice resembles the SiC substrate lattice resulting in less strained graphene on the SiC substrate 12.

Layer 16 should be at least 1 monolayer thick to enable epitaxy regrowth for additional layers. In one embodiment, layer 16 forms a contact layer that is epitaxially grown on layer 14. Epitaxial layer growth (layer 16) on the spreading layer 14 is optional. Any semiconductor 18, e.g., SiGe, III-nitrides (GaN, InN, AlN, etc.), III-arsenides, III-phosphides, etc. can be grown on the graphene of layer 14 as long as the lattice constant matches.

An additional layer or layers 18 may include GaN or other substrate materials. GaN can act as a buffer layer as well as a contact layer in electronic structures. It should be understood that layer 16, if employed, may include a highly doped layer, such as, p-SiC. Alternately, the material of layer 16 (p-SiC) may be replaced with p-GaN or a second contact layer may be formed from p-GaN. Layer 18 is shown in bulk for simplicity, but may include an active layer, contact layers, blocking layers, etc. as will be described in greater detail with respect to illustrative structures described below.

Figure 2:
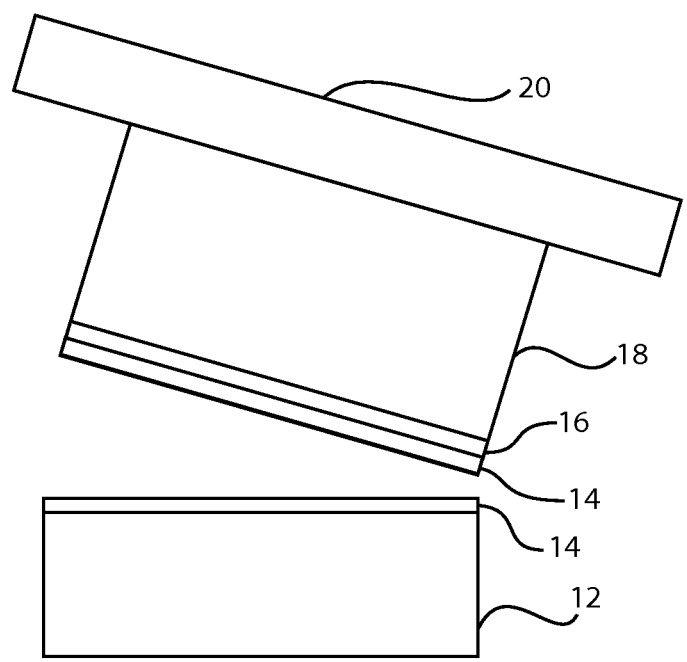
FIG. 2 is a cross-sectional view of the structure of FIG. 1 wafer bonded to a handle substrate and split at the spreading layer in accordance with the present principles.

Referring to FIG. 2, a handle substrate 20 may be adhered to layer 18. Handle substrate 20 may include any suitable material and may include a flexible material. Next, a cleaving process is employed to split or spread the spreading layer 14 to divide the single crystal substrate 12 from the layer 16 (and/or layer 18). The single crystal substrate 12 is reusable for other steps or for growing additional layers (layer 16 or layer 18) for other devices. The cleaving process includes a layer splitting by mechanical force (e.g., spalling, smart-cut, etc.). In this way, layer 18 can be lifted off of substrate 12. By applying stress, graphene 14 and/or the semiconductor substrate 18 is/are separated from the substrate (SiC) 12 because graphene is weakly bonded to SiC. Graphene on SiC can be a seed for any epitaxial materials and epitaxial layers formed on top of the graphene are transferred using the handle substrate 20. The layer 18 may be employed for forming electronic devices, such as LEDs, transistors, photoelectronic devices, optics devices, etc. as will be described in greater detail below.

Figure 3A:
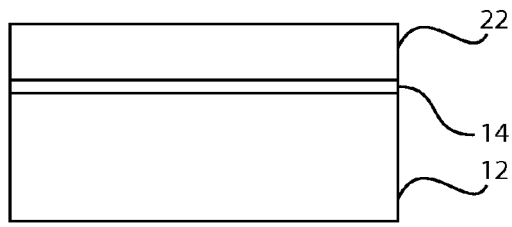
FIGS. 3A-3E show method steps for providing a stress free GaN layer in accordance with one embodiment.
Figure 3B:
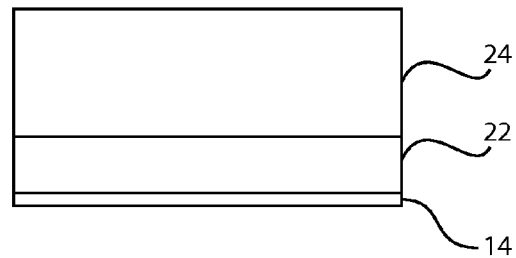
Figure 3C:
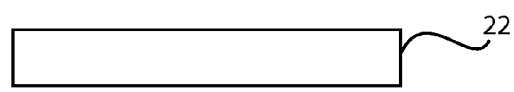
Figure 3D:
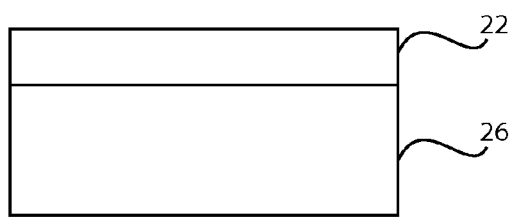
Figure 3E:
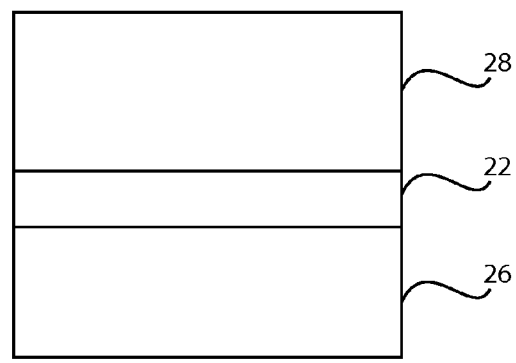

Referring to FIG. 3A, another embodiment shows steps for achieving a defect free III-nitride material for use in forming LEDs. Starting with a single crystal substrate 12, a spreading layer 14 is formed on the substrate 12. An ultra-thin strained GaN (unrelaxed) layer 22 (or other material) is formed on the spreading layer 14. A soft-substrate 24 is formed on the layer 22. The soft substrate 22 may include tape or foil employed to protect the layer 22. The spreading layer 14 is split to lift-off the layer 22 in FIG. 3B. In FIG. 3C, the spreading layer 14 (e.g., graphene) is etched with an $O_2$ plasma to remove the spreading layer 14. The soft substrate 24 is removed using a chemical solution. Removal of the substrate 12 and the spreading layer 14 relaxes the stress in the ultra-thin layer 22. In FIG. 3D, the relaxed ultra-thin layer 22 is mounted using adhesive or other bonding technique on a high temperature substrate 26. The relaxed ultra-thin layer 22 is now employed to epitaxially grow a thick GaN film 28 that is defect free in FIG. 3E. This film may be bonded to others to form the structures as described below. It should also be understood that the techniques described above with respect to FIGS. 1, 2 and 3A-3E may include additional layers employed to form electronic devices, such as LEDs, transistors, photonic devices, etc. in accordance with the present principles.

The following description includes several structures that may employ the lift-off and defect free substrate processes to form electronic device structures. These structures may be formed using a combination of wafer transfer processes and epitaxial growth processes. The structures in accordance with the present principles employ higher thermal conductivity material, take advantage of thin films stacked in a vertical column and do not employ a base substrate (which would be employed for conductive channels). In particularly useful embodiments, SiC and GaN layers are employed together. These materials have less lattice-mismatch (closer lattice constants for SiC and GaN). The closer lattice constants result in improved performance and reliability with minimal dislocation density in GaN films compared to GaN films on thick substrates such as sapphire. SiC and GaN have less wafer curvature mismatch between them since thermal expansion coefficients for SiC and GaN are closer than conventional materials (e.g., sapphire substrates). SiC and GaN have improved uniformity and larger wafer diameters. This is a consideration for wafer transfer processes.

The present principles, enable the removal of a base substrate (substrate release) using a graphene spreading layer between SiC materials. This results in reduced cost, better carrier injection via back contact formation, improved light extraction via reflector allocation, improved thermal management due to direct bonding. More light extraction (no light reabsorption) in the LED is provided due to SiC's wide bandgap. The SiC single substrate is reusable, which reduces cost. The structures and processes described herein will refer to LED devices for simplicity; however, the present principles are applicable to any electronic devices, especially those employing difficult to process III-nitride materials.

In accordance with the present principles, the electron crowding issue for LED substrates using GaN materials is solved by employing vertically layered thin films. This structure also provides improved carrier injection and more uniform light generation for LEDs and the like. Back contact patterning and adding back reflectors are possible and easier (i.e., to further improve light extraction). The structures in accordance with the present principles increase LED yield and density. Better thermal management is achieved due to the thin film design and orientation as well as the use of high thermal conductivity materials, e.g., SiC is provided. In addition, the substrateless stack permits easier die bonding by permitting the option for epilayer (active layer) up or down bonding. The epilayer can be reversible since no base substrate is present. Further, flexible LED arrays or devices as well as transparent or more transparent LED devices (visually invisible due to material selection, e.g., SiC use) are provided.

Figure 4:
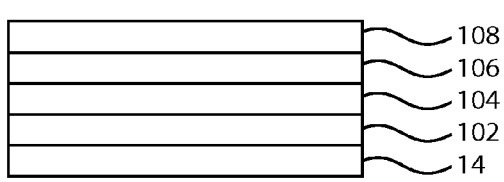
FIG. 4 is cross-sectional view of a light emitting diode structure having SiC and graphene layers in accordance with one illustrative embodiment.

Referring to FIG. 4, a first structure 100 includes a spreading layer 14 that has been lifted off a single crystal substrate. The spreading layer 14 may include 1-2 monolayers of graphene. A p-SiC contact layer 102 (layer 16 in FIG. 1) is formed on the spreading layer 14. The contact layer may include a thickness of 0.3-300 nm of p-doped SiC.

Contact layer 102 is epitaxially grown layer on the spreading layer 14 (e.g., graphene). The layer 102 may include SiC. Layer 102 should be at least 1 monolayer thick for epitaxy regrowth. Since SiC has a high thermal conductivity, a whole p-contact can be composed of p-SiC. In such as case layer 102 should have a high doping level of about $0.5 \times 10^{18}$ cm$^{-3}$ to about $5 \times 10^{18}$ cm$^{-3}$.

A blocking layer 104 is formed on the contact layer 102. The blocking layer 104 may include 10-100 nm of p-doped AlGaInN for an LED design. The p-type current blocking layer 104 includes Al and In content, which depends on the emission wavelength (active layer design) as enough conduction band offset is needed for proper electron blocking. Layer 104 may include just AlGaN with 20% Al and a thickness of about 25 nm.

An active layer 106 is formed on the blocking layer 104. The active layer 106 includes an active stack composed of GaN/InGaN/GaN layers with a total thickness between 2 and 100 nm. This multiple quantum well (MQW) structure can be 2-5 nm thick/1-4 nm thick/2-5 nm thick (for GaN/InGaN/GaN) totaling about 3-9 nm per GaN/InGaN period. Usually, multiple periods are used for higher power devices 3 to 8 periods (layer sets) are common, making the active layer thickness as thick as about 100 nm. Another contact layer 108 is formed on the active layer 106. The contact layer 108 may include n-doped GaN. This layer is the n-contact layer. It is about 500 nm thick but can be made any thickness, e.g., if thinner, it needs to have a higher doping concentration. Dependent upon the application, thinner can enable higher light extraction as well.

Figure 5:
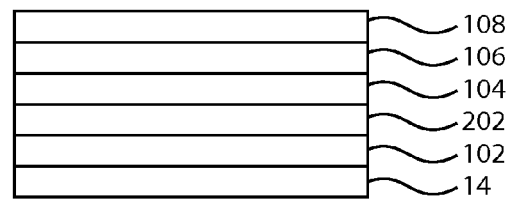
FIG. 5 is cross-sectional view of the light emitting diode structure of FIG. 4 having an additional contact layer in accordance with one illustrative embodiment.

Referring to FIG. 5, another structure 200 includes the same layers as structure 100 with the addition of a second p-contact layer 202. In one embodiment, a p-contact layer 202 is epitaxially grown on layer 102. Layer 202 may include GaN. GaN can act as a buffer layer as well as a contact layer. It should be understood that if a highly doped p-SiC is employed for layer 102, layer 202 may not be needed. Alternately, the material of layer 102 (p-SiC) can be replaced with p-GaN. Contact layer 202 includes a p-doped GaN layer having a thickness between about 100-1000 nm.

Figure 6:
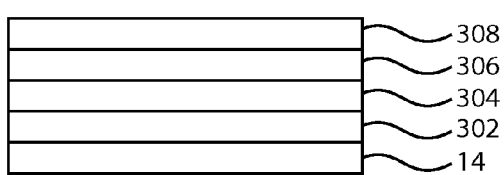
FIG. 6 is cross-sectional view of a light emitting diode structure having SiC and graphene layers in accordance with another illustrative embodiment.

Referring to FIG. 6, another structure 300 includes reversed p- and n-contacts from structure 100. A spreading layer 14 is provided, which may include atomically smooth 1-2 monolayers of graphene. An n-contact layer 302 may include n-SiC grown atop of the spreading layer 14 (e.g., graphene). Since SiC has a higher thermal conductivity, a whole n-contact can be composed of n-SiC. The doping should be high, e.g., 0.5 to $5 \times 10^{18}$ cm$^{-3}$. n-SiC can be replaced by or employed with n-GaN as well (see structure 400, FIG. 7). The GaN can act as a buffer as well as a contact layer. An active layer 304 may include a multiple quantum well (MQW) structure that may include alternating layers of GaN and InGaN. The active layer 304 is composed of a GaN/InGaN/GaN stack. This structure can be 2-5 nm thick/1-4 nm thick/2-5 nm thick, totaling about 3-9 nm per GaN/InGaN period. Usually, multiple periods are used for higher power devices, e.g., 3 to 8 periods are common making the active layer 304 thickness as thick as 100 nm.

A current blocking layer 306 may include p-doped AlGaInN. The Al and In content depends on the emission wavelength (active layer design) as enough conduction band offset is needed for proper electron blocking. AlGaN may be employed for the blocking layer 304 with 20% Al and a thickness of about 25 nm. A p-contact layer 308 may include p-GaN. This layer 308 is the p-contact layer and may be about 500 nm in thickness but can be made any thickness. If thinner, higher doping is needed. Dependent upon the application, thinner layers can enable higher light extraction.

Figure 7:
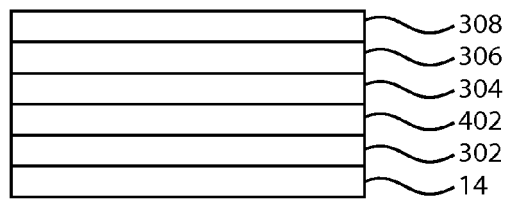
FIG. 7 is cross-sectional view of the light emitting diode structure of FIG. 6 having an additional contact layer in accordance with one illustrative embodiment.

Referring to FIG. 7, another structure 400 includes the same layers as structure 300 with the addition of a second n-contact layer 402. In one embodiment, an n-contact layer 402 is epitaxially grown on layer 302. Layer 402 may include n-doped GaN. GaN can act as a buffer layer as well as a contact layer. It should be understood that if a highly doped n-SiC is employed for layer 302, layer 402 may not be needed. Alternately, the material of layer 302 (n-SiC) can be replaced with n-GaN. Contact layer 402 includes an n-doped GaN layer having a thickness between about 100-1000 nm.

In addition to the materials employed in accordance with the present principles, new structures are provided to reduce charge carrier crowding. E.g., in conventional LEDs, a top contact and a back contact are formed laterally adjacent to each other on a substrate, and charge flows between the top and back contact and flows laterally between the two contacts (lateral injection). In accordance with the present principles, top and back contacts are vertically aligned such that charge is directly injected. The electron crowding issue is solved or significantly alleviated using direct injection rather than lateral injection.

Figure 8:
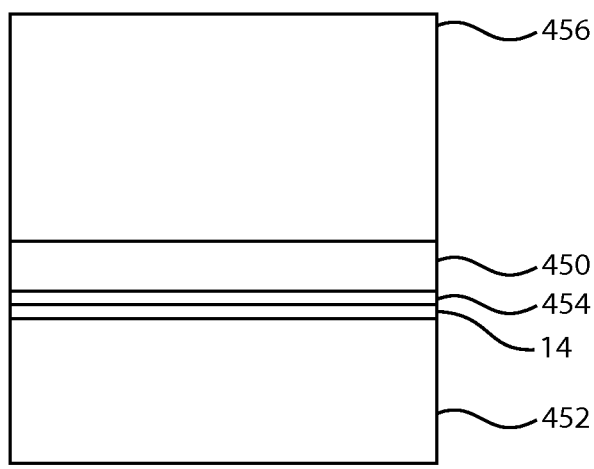
FIG. 8 is a cross-sectional view of a structure having a buffer layer formed between crystal materials to reduce stress in accordance with the present principles.

Referring to FIG. 8, regarding semiconductor wafer dimensions, commercially available SiC wafers have a diameter of 4 inches. There are advantages to employing a 300 mm SiC wafer diameter (similar to Si wafer sizes) to make the processing more amenable to Si wafer processing techniques. To do so an engineered buffer 450 may be employed on an epitaxially grown SiC layer (e.g., between the SiC and GaN based layers of the structures described above). A 300 mm SiC wafer may be employed for the single crystal substrate 452 (see also substrate 12) with proper strain engineering. GaN has a lower thermal expansion coefficient (TEC) mismatch with SiC than Si (that is currently grown on 300 mm wafers). The engineered buffer 450 may be composed of AlGaN and/or GaN and include a thickness of about 1-3 microns between an epitaxially grown SiC layer 454 and a GaN active structure 456. The buffer layer 456 is either n-type or p-type depending on the structure and should include the same doping as the epi SiC layer 454 grown after a graphene layer 14.

By employing the illustrative techniques shown in FIG. 8, 300 mm SiC and/or GaN (or other semiconductor materials) may be formed. This method may be employed to provide any sized wafer to expedite or simplify processing.

Figure 9A:
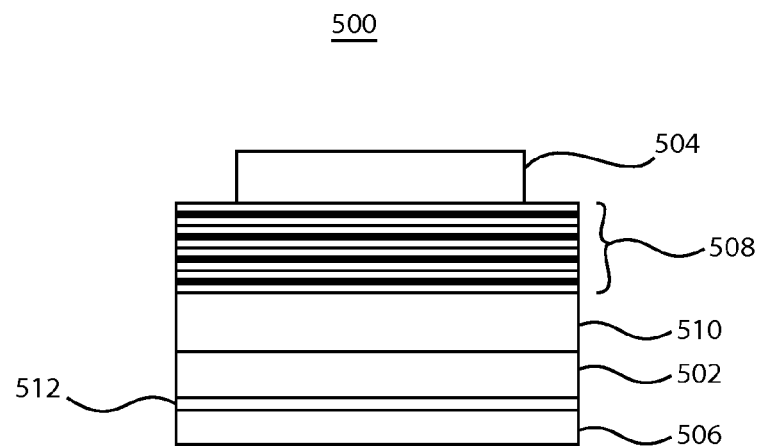
FIG. 9A is a cross-sectional view of an LED having a vertical structure and including a back reflector in accordance with the present principles.

Referring to FIG. 9A, an LED structure 500 is shown in accordance with one illustrative embodiment. The LED structure 500 includes a back contact 502 and a top contact 504 disposed in a vertical column-like configuration. This configuration provides improved carrier injection, more uniform light generation with increasing current intensity and preserved lighting profile uniformity. The back contact 502 can be patterned without disturbing the front contact 504 since the contacts are on opposite sides of the structure (substrateless).

In addition, a back reflector 506 may be added to the back surface to enhance light output. For example, back reflectors may include brag light reflectors based on passivation layers (such as $SiO_2/TiO_2$) (i.e., improved light extraction). The structure 500 further increases LED yield/density by permitting reduced contact space as the top contact 502 and back contact 504 are aligned in the same vertical plane rather than a horizontal one. Other layers depicted include an active layer 508, blocking layer 510 and spreading layer 512. Note the blocking layer 510 may be removed depending on the doping of the other layers.

Figure 9B:
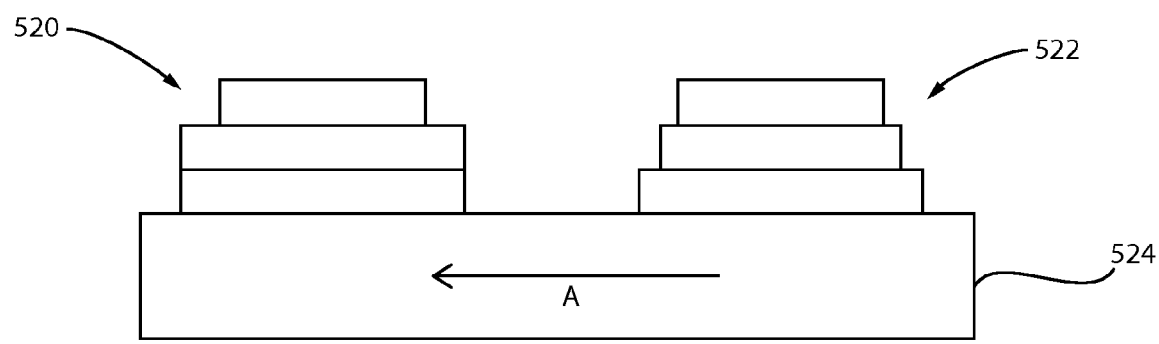
FIG. 9B is a cross-sectional view of a split contact structure in accordance with the prior art.

Referring to FIG. 9B, in contrast to FIG. 9A, the conventional approach shows a top contact 520 and a back contact 522 adjacent to each other on a substrate 524. Carrier flow between the contacts 520 and 522 occurs laterally through the substrate (arrow "A"). This gives rise to many drawbacks including charge crowding and the like.

Figure 10:
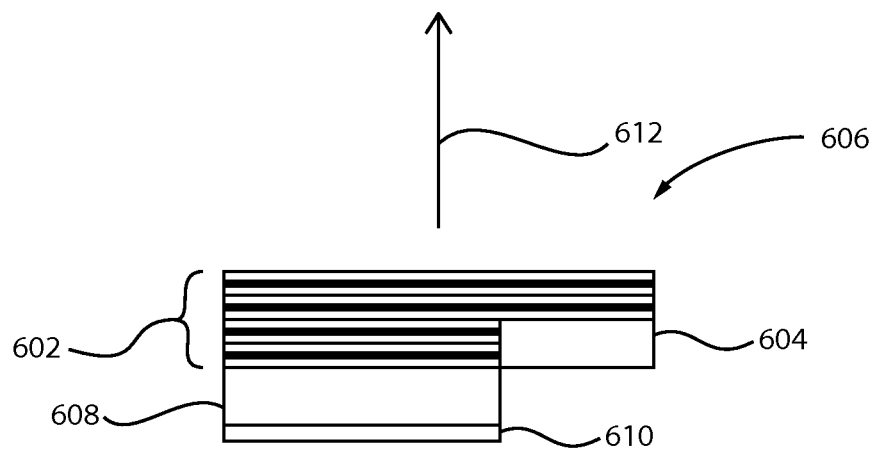
FIG. 10 is a cross-sectional view of an LED structure showing reflective contacts and a roughened surface in accordance with one illustrative embodiment.

Referring to FIG. 10, light extraction improvements can be realized in accordance with an illustrative LED structure 600. For InGaN LEDs with an $n_{GaN}$ of 2.5, $\theta_C$ about 23°, the light extraction efficiency is expected to be only 4%, assuming that one light escape cone is present in the LED structure. To improve light extraction in LEDs, many approaches may be employed including the fabrication of LEDs with a patterned sapphire substrate, LEDs with a roughened top surface, LEDs with textured p-GaN layer, LEDs with a photonic crystal structure, etc. Since silicon absorbs visible light, silicon is preferably removed from the LED device.

Structure 600 includes a thin-film flip chip having an n-doped GaN active layer 602 with a reflective n-contact 604 in an undercut section of the substrate 602. The substrate 602 includes a roughened top surface 606. A p-GaN layer 608 has a reflective p-contact (p-GaN) 610 formed thereon. The reflective contacts 604 and 610 reflect generated light 612 upward and the roughened surface 606 directs and diffuses generated light.

Since the lifetime of an LED depends strongly on the junction temperature, thermal management is an important concern for LED devices. The temperature difference between two points is given by:

$$T_2 - T_1 = \frac{q \times L}{k \times A}$$

where k is thermal conductivity, q is the amount of heat being transferred through the material, L is the material's effective thickness parallel with the flow of heat, and A is the effective area of the thermal path.

The junction temperature of a typical high power LED ranges between 75-125° C. Higher thermal conductivity, higher surface area, and thinner materials will be the best selection for most improved thermal management. The present principles achieve lower junction temperatures by exploiting material properties and dimensions to reduce heat storage and include heat flow away from the junction. For example, by employing SiC and graphene higher thermal conductivity is achieved over conventional structures.

Current crowding in lateral LEDs contributes to inefficiencies in carrier flow and heat transfer. Lateral LEDs can be thought of as two adjacent "mesas" and current needs to flow through a substrate between the mesas. The equation for current density is:

$$J(x) = J(0)\exp\left(-\sqrt{\frac{\rho_n}{t_n(\rho_c + \rho_p t_p)}}x\right). \tag{1}$$

A definition of current spreading length is:

$$J(L_s)/J(0) = 1/e \tag{2}.$$

Equation (1) is solved using Equation (2) to provide:

$$L_s = \sqrt{\frac{(\rho_c + \rho_p t_p) t_n}{\rho_n}}. \tag{3}$$

In the above, J(0)=current density at the edge of the mesa; $\rho_n$ and $\rho_p$=resistivities of the n-type and the p-type layers, respectively; $t_n$ and $t_p$=thicknesses of the n-type and the p-type layers, respectively; $\rho_c$=p-type specific contact resistance. $L_s$ is the current spreading length. Typical values for LEDs include: $t_n$=800 nm; $t_p$=100 nm; $\rho_n$=0.02 Ω·cm; $\rho_c$=5.4×10$^{-3}$ Ω·cm$^2$; $\rho_p$=125 Ω·cm; $L_s$=52 µm. Current spreading length, $L_s$, is defined as the length where the current density has dropped to 1/e of its value at the edge of the mesa ($J(L_s)/J(0)$=1/e).

Current crowding in LEDs causes device degradation due to high localized heating effects. Most of the current passing through the LED is located at the outer edge(s) of the mesa, i.e., the shortest distance between the two contacts that form the mesas. Higher doping in the contact layers and increased thickness of the current spreading layers are the only solutions to overcome this issue. However, these solutions are limited by several factors including limitations of the in-situ epilayer growth capabilities.

In accordance with the present principles, improvements in thermal management are provided by eliminating a conduction substrate and by employing better conductive materials such as SiC rather than GaN or sapphire. By way of example, thermal conductivity of the conventional substrate sapphire is 42 W/m-K: GaN=130 W/m-K, and SiC=490 w/m-K. Thus, the junction temperature of the thin film LED in accordance with the present principles will be significantly lower than that of conventional LEDs.

Regarding the LED single die dimensions (area), the area of an LED is limited by current spreading and heating. Larger LED die area increases the power but increases the problem of heat dissipation. SiC has a much better thermal conductivity reducing the junction temperature by at least 10 degrees (often more) (from temperatures for conventional designs). If made as a thin film, this junction temperature reduction should be greater as GaN will be replaced with SiC (and SiC is a better thermal conductor by about three times). In addition the active layer of the LED will be closer to the heat sink (from 300 microns to about a few of microns, which is a significant distance reduction). This increases device lifetime and/or permits larger die area to achieve higher output power. The larger area results in more current and therefore power. The lifetime and power can be balanced as needed. For example, a similar architecture may be employed with a longer lifetime, or a higher power architecture may be employed with a same lifetime but outputting more power.

In addition to performance and thermal management advantages, LEDs formed in accordance with the present principles permit packaging advantages as well. For example, die bonding is easier when an option for epilayer up or epilayer down bonding is available (i.e., chip is reversible). That is, the epilayer (e.g., SiC epilayer and/or others) can be inverted to generate much better integration techniques by providing more options. Furthermore, elimination of the substrate enables placement of stand-alone thin film LEDs on flexible substrates or other boards or platforms. As these materials have a large bandgap, they are transparent as well. Thus, flexible and transparent devices can be realized for LEDs, transistors, optical modulators, photonics etc.

Figure 11:
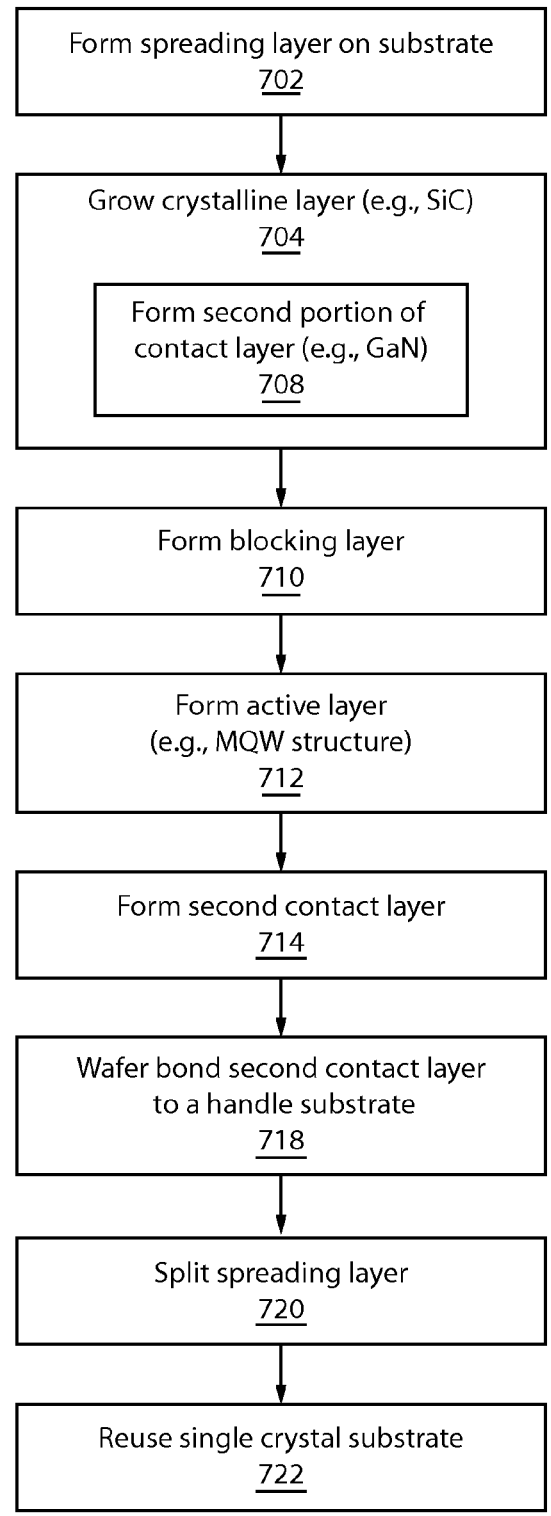
FIG. 11 is a block/flow diagram showing methods for fabricating an LED in accordance with illustrative embodiments.

Referring to FIG. 11, methods for forming an electronic structure (e.g., a light emitting diode) are illustratively shown. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 702, a spreading layer is formed on a single crystalline substrate, e.g., SiC. The spreading layer includes one to five monolayers of graphene or other 2D material, preferably about one monolayer. The spreading layer may include graphene and be formed by thermal decomposition of a SiC substrate. Alternately, the spreading layer may include epitaxially deposited graphene.

In block 704, a crystalline layer is grown to form a first contact layer. The layer may include a thickness of between about 0.3 nm and about 300 nm and may include SiC, although other materials may be employed. Depending on the conductivity (i.e., the doping concentration of the epitaxially grown SiC layer), a second first contact layer may be employed including GaN or other III-nitride layer in contact with the SiC layer in block 708. The structure provided by block 704 may be employed in any electronic device, e.g., an LED, a transistor, a photonic device, etc. For example, the "first contact layer" may be employed to form a transistor channel and source/drain regions. Additional layers may be formed on the first contact layer to create gate structures and the like.

Following with the illustrative LED example or other structures, in block 710, a blocking layer may be formed, e.g., AlGaInN, between the contact layer and an active layer. In block 712, the active layer is formed including one or more GaN layers (or other III-nitride material) on the crystalline layer (e.g., on or over the contact layer or layers) or the blocking layer. The active layer may include forming a multiple quantum well (MQW) structure. The MQW structure may include a plurality of GaN/InGaN periods having a total thickness of less than about 100 nm.

In block 714, a second contact layer is formed over the active layer, wherein the active layer is disposed vertically between the first and second contact layers. The first contact layer and the second contact layer may be separated by a distance of 100 nm or less.

In block 718, the second contact layer is wafer bonded to a handle substrate. In block 720, the spreading layer is split to remove the single crystalline substrate. In block 722, the single crystalline substrate is reused for further processing.

An LED may be individually packaged and may be reversible, or the LED may be formed as an array of LEDs. The LED or LEDs may be placed on a flexible and/or transparent media and employed in any number of applications from appliances, military applications, vehicles, electronic displays, etc. The steps as described with reference to FIG. 11 may be adapted to forming transistors, diodes, photonic devices or other electronic devices. The present principles preferably employ SiC, graphene, GaN or other III-nitrides together to create better performing electronic devices and overcome the limitations of the prior art. By employing wafer transfer methods, SiC/GaN devices may be realized, and thin film vertically disposed devices can be fabricated without the need for a base substrate. The thin film devices may be transferred to chips, boards or other platforms as an array or as an individual device.

Having described preferred embodiments for thin film wafer transfer and structure for electronic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for wafer transfer, comprising:
   forming a spreading layer on a single crystalline substrate, the spreading layer including a material having strong bonds in two dimensions and weak bonds in a third dimension, the spreading layer being spread to lattice match the single crystalline substrate;
   growing a crystalline layer on the spreading layer such that the crystalline layer is lattice matched to the single crystalline substrate;
   forming one or more semiconductor layers on the crystalline layer, wherein the crystalline layer includes SiC, the spreading layer includes grapheme and the one or more semiconductor layers includes GaN;
   transferring the one or more semiconductor layers to a handle substrate; and
   splitting the spreading layer along the weak bonds to remove the single crystalline substrate.

2. The method as recited in claim 1, wherein the spreading layer includes one to five monolayers of graphene.

3. The method as recited in claim 1, wherein the single crystalline substrate includes one of SiC, SiGe, a III-nitride, III-arsenide, and a III-phosphide.

4. The method as recited in claim 1, wherein growing the crystalline layer on the spreading layer includes epitaxially growing the crystalline layer.

5. The method as recited in claim 1, wherein the single crystalline substrate includes SiC and forming a spreading layer includes thermally decomposing the SiC to form a graphene spreading layer.

6. The method as recited in claim 1, wherein forming the spreading layer includes epitaxially growing a graphene spreading layer.

7. The method as recited in claim 1, wherein the one or more III-nitride layers form active layers for an electronic device.

8. The method as recited in claim 1, further comprising reusing the single crystalline substrate for further processing.

9. A method for wafer transfer to form an electronic device, comprising:
   forming a spreading layer on a single crystalline substrate;
   growing a crystalline layer on the spreading layer to form a first contact layer such that the crystalline layer is lattice matched to the single crystalline substrate;
   forming an active layer including one or more III-nitride layers on the crystalline layer, wherein the crystalline layer includes SiC, the spreading layer includes graphene and the one or more III-nitride layers includes GaN;
   forming a second contact layer over the active layer, wherein the active layer is disposed vertically between the first and second contact layers;
   transferring the second contact layer to a handle substrate; and
   splitting the spreading layer to remove the single crystalline substrate.

10. The method as recited in claim 9, wherein the spreading layer includes one to five monolayers of graphene.

11. The method as recited in claim 9, wherein forming the active layer includes forming a multiple quantum well (MQW) structure.

12. The method as recited in claim 11, wherein MQW structure includes a plurality of GaN/InGaN periods having a total thickness of less than about 100 nm.

13. The method as recited in claim 9, further comprising reusing the single crystalline substrate for further processing.

14. The method as recited in claim 9, wherein the first contact layer and the second contact layer are separated by a distance of 100 nm or less.

15. The method as recited in claim 9, wherein the single crystalline substrate includes one of SiC, SiGe, a III-nitride, III-arsenide, and a III-phosphide.

16. The method as recited in claim 9, wherein the single crystalline substrate includes SiC and forming a spreading layer includes thermally decomposing the SiC to form a graphene spreading layer.

17. The method as recited in claim 9, wherein forming the spreading layer includes epitaxially growing a graphene spreading layer.

18. A method for wafer transfer, comprising:
   forming a spreading layer, including graphene, on a single crystalline SiC substrate;
   growing a crystalline SiC layer on the spreading layer;
   forming a semiconductor layer including one or more layers lattice matched to the single crystalline SiC substrate;
   transferring the semiconductor layer to a handle substrate; and
   splitting the spreading layer to remove the single crystalline SiC substrate.

19. The method as recited in claim 18, further comprising reusing the single crystalline SiC for further processing.

20. The method as recited in claim 18, wherein the single crystalline substrate includes SiC and forming a spreading layer includes one of: thermally decomposing the SiC to form a graphene spreading layer; and epitaxially growing a graphene spreading layer.

* * * * *